(12) United States Patent
King et al.

(10) Patent No.: US 8,482,281 B2
(45) Date of Patent: Jul. 9, 2013

(54) APPARATUS AND METHOD FOR PARALLEL TRANSMISSION OF RF PULSES IN A SPIN ECHO SEQUENCE

(75) Inventors: Kevin F. King, Menomonee Falls, WI (US); Dan Xu, Oconomowoc, WI (US)

(73) Assignee: General Electric Company, Schenectady, NY (US)

( * ) Notice: Subject to any disclaimer, the term of this patent is extended or adjusted under 35 U.S.C. 154(b) by 527 days.

(21) Appl. No.: 12/752,368

(22) Filed: Apr. 1, 2010

(65) Prior Publication Data

US 2011/0241672 A1   Oct. 6, 2011

(51) Int. Cl.
*G01V 3/00* (2006.01)

(52) U.S. Cl.
USPC .......................................................... 324/309

(58) Field of Classification Search
USPC ........................... 324/300–322; 600/410–435
See application file for complete search history.

(56) References Cited

U.S. PATENT DOCUMENTS

| | | | |
|---|---|---|---|
| 5,570,019 A * | 10/1996 | Moonen et al. | 324/309 |
| 6,046,589 A * | 4/2000 | Lamerichs et al. | 324/309 |
| 6,054,853 A * | 4/2000 | Miyamoto et al. | 324/309 |
| 6,332,088 B1 * | 12/2001 | Zhang et al. | 600/410 |
| 6,420,870 B1 * | 7/2002 | Kiefer | 324/307 |
| 6,493,569 B2 * | 12/2002 | Foo et al. | 600/410 |
| 6,667,617 B2 * | 12/2003 | Heubes | 324/307 |
| 7,075,299 B1 * | 7/2006 | Peters | 324/309 |

OTHER PUBLICATIONS

Xu et al., "Designing RF Refocusing Pulses for Parallel Transmit Spin Echo Sequences," ISMRM, 2009, p. 2892.
Xu et al., "Joint Design of Excitation and Refocusing Pulses for Fast Spin Echo Sequences in Parallel Transmission," ISMRM, 2009, p. 2903.
Conolly et al., "Optimal Control Solutions to the Magnetic Resonance Selective Excitation Problem," IEEE Transactions on Medical Imaging, vol. MI-5, No. 2, Jun. 1986, pp. 106-115.
Hennig et al., "RARE Imaging: A Fast Imaging Method for Clinical MR," Magnetic Resonance in Medicine, vol. 3, 1986, pp. 823-833.
Katscher et al., "Transmit SENSE," Magnetic Resonance in Medicine, vol. 49, 2003, pp. 144-150.
Meiboom et al., "Modified Spin-Echo Method for Measuring Nuclear Relaxation Times," The Review of Scientific Instruments, vol. 29, No. 8, Aug. 1958, pp. 688-691.
Pauly et al., "A Linear Class of Large-Tip-Angle Selective Excitation Pulses," Journal of Magnetic Resonance, vol. 82, 1989, pp. 571-587.

(Continued)

*Primary Examiner* — Dixomara Vargas
(74) *Attorney, Agent, or Firm* — Ziolkowski Patent Solutions Group, SC (57) ABSTRACT

A method, system, and apparatus including a magnetic resonance imaging (MRI) apparatus that includes an MRI system having a plurality of gradient coils, a radio-frequency (RF) transceiver system, an RF switch controlled by a pulse module to transmit RF signals to an RF coil assembly, and a computer. The computer is programmed to implement a spin echo sequence to acquire magnetic resonance (MR) data, where the spin echo sequence includes an excitation RF pulse and at least one refocusing pulse per repetition time (TR) of the excitation pulse. The computer is also programmed to transmit at least two component RF pulses in parallel channels during implementation of the spin echo sequence to produce a first refocusing RF pulse and programmed to reconstruct an image from spin echo sequence image data.

20 Claims, 3 Drawing Sheets

OTHER PUBLICATIONS

Setsompop et al., "Parallel RF Transmission With Eight Channels at 3 Tesla," Magnetic Resonance in Medicine, vol. 56, 2006, pp. 1163-1171.

Xu et al., "Designing Multichannel, Multidimensional, Arbitrary Flip Angle RF Pulses Using an Optimal Control Approach," Magnetic Resonance in Medicine, vol. 59, 2008, pp. 547-560.

Xu et al., "Optimal Control Design of Phase-Relaxed Parallel Transmission RF Pulses for Arbitrary Flip Angles," Proc. Intl. Soc. Mag. Reson. Med., vol. 16, 2008, p. 618.

Zhu, "Parallel Excitation With an Array of Transmit Coils," Magnetic Resonance in Medicine, vol. 51, 2004, pp. 775-784.

* cited by examiner

APPARATUS AND METHOD FOR PARALLEL TRANSMISSION OF RF PULSES IN A SPIN ECHO SEQUENCE

BACKGROUND OF THE INVENTION

Embodiments of the invention relate generally to magnetic resonance (MR) imaging and, more particularly, to the parallel transmission of radio-frequency (RF) pulses during a spin echo sequence.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. As appreciated by those skilled in the art, one or more radio-frequency (RF) pulses are generally employed to create the excitation field, $B_1$, which is applied to the substance or tissue, thus manipulating an ensemble of spins thereof.

After application of the $B_1$ excitation field, a signal is emitted by the ensemble of spins is acquired and processed to form an image. Depending on the technique employed, the ensemble of spins may be subjected intervening acts prior to acquisition of the image signal. For example, with gradient echo imaging, one or more gradient reversals are employed to produce the image signal. Alternatively, with regard to spin echo imaging, one hundred and eighty degree RF pulses are generally employed to create the image signal. Regardless of the imaging technique employed, the resulting set of received NMR signals is digitized and processed to reconstruct the image.

Due, in part, to the complexity of MR imaging, image artifacts may be present in the reconstructed images. Image artifacts can have a variety of causes. For example, inhomogeneity in the $B_1$ excitation field produced by an RF pulse can cause image artifacts such as the shading artifact.

It would therefore be desirable to have a system and method capable of minimizing inhomogeneity in the $B_1$ excitation field.

BRIEF DESCRIPTION OF THE INVENTION

In accordance with another aspect of the invention, a magnetic resonance imaging (MRI) apparatus including an MRI system having a plurality of gradient coils positioned about a bore of a magnet, a radio-frequency (RF) transceiver system, an RF switch controlled by a pulse module to transmit RF signals to an RF coil assembly to acquire MR images, and a computer. The computer is programmed to implement a spin echo sequence to acquire magnetic resonance (MR) data from an object, where the spin echo sequence includes an excitation RF pulse and at least one refocusing pulse per repetition time (TR) of the excitation pulse. The computer is also programmed to transmit at least two component RF pulses in parallel channels during implementation of the spin echo sequence to refocus a plurality of spins in the object and programmed to reconstruct an image from spin echo sequence image data. The at least two RF pulses are configured produce a first refocusing RF pulse that refocuses the plurality of spins in the object.

In accordance with another aspect of the invention, a method of magnetic resonance (MR) imaging includes implementing a spin echo acquisition sequence, where the spin echo sequence includes an excitation pulse and one of a single refocusing pulse per repetition time (TR) of the excitation pulse and multiple refocusing pulses per TR of the excitation pulse. The method also includes transmitting a plurality of RF component refocusing pulses during the spin echo acquisition sequence such that the plurality of RF component refocusing pulses superpose to create one of the single refocusing pulse and one refocusing pulse of the multiple refocusing pulses. The method further includes acquiring MR data from an echo generated in response one of the single refocusing pulse and the one refocusing pulse of the multiple refocusing pulses, reconstructing an MR image from the acquired MR data, and displaying the MR image.

In accordance with yet another aspect of the invention, a computer readable storage medium having a sequence of instructions stored thereon is set forth. The instructions cause the computer to acquire magnetic resonance (MR) data from an object via application of a spin echo sequence, where the spin echo sequence includes an excitation RF pulse and N refocusing pulse(s) per repetition time (TR) of the excitation RF pulse. N is one of an integer equal to one and an integer greater than one. The instructions also cause the computer to create a first refocusing pulse of the N refocusing pulse(s) via a parallel transmission of at least two component RF refocusing pulses, and reconstruct an image from MR data acquired via the spin echo sequence.

Various other features and advantages will be made apparent from the following detailed description and the drawings.

BRIEF DESCRIPTION OF THE DRAWINGS

The drawings illustrate preferred embodiments presently contemplated for carrying out aspects of the invention.

In the drawings.

DETAILED DESCRIPTION

Figure 1:
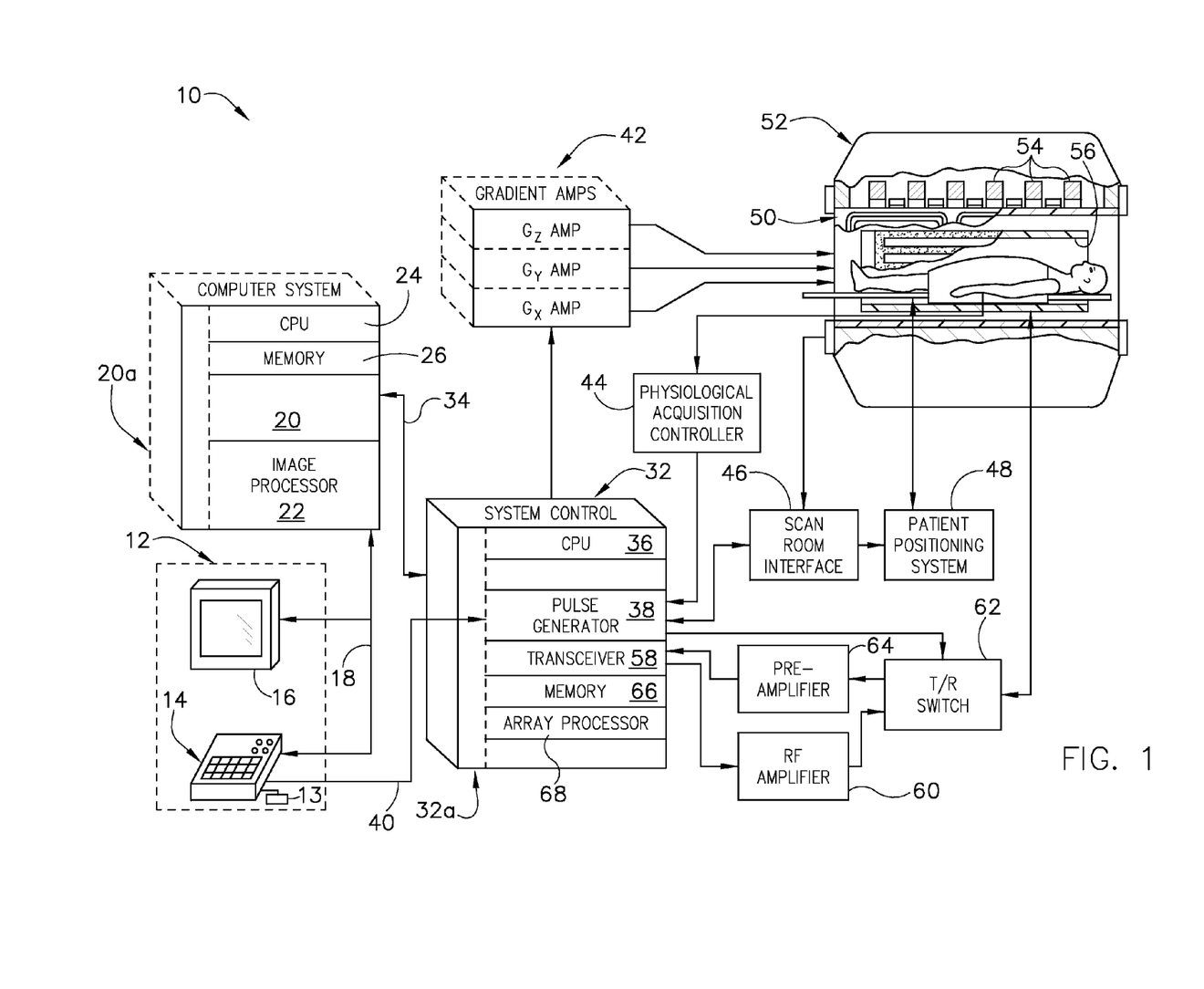
FIG. 1 is a block diagram of an MR system according to an embodiment of the invention.

Referring to FIG. 1, the major components of a preferred magnetic resonance imaging (MRI) system 10 incorporating an embodiment of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26, known in the art as a frame buffer for storing image data arrays. The computer system 20 communicates with a separate system control 32 through a high speed serial link 34. The input device 13 can include a mouse, joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a Pre-amplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the Pre-amplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

Memory module 26 and memory module 66 are tangible and non-transitory storage media such as magnetic drives, optical drives, or the like. It is contemplated that memory module 26 and/or memory module 66 include a set of instructions (e.g., a program) for carrying out embodiments of the invention. However, a portable and tangible storage device (not shown) could be used to store instructions for carrying out embodiments of the inventions.

Embodiments of the invention are directed to the generation of a refocusing pulse via the production of at least two RF pulses transmitted in parallel. The refocusing pulse, which is a superposition of the at least two RF pulses transmitted in parallel over at least two channels, serves to refocus an ensemble of spins during a spin echo acquisition period. A variety of benefits flow from the generation of such a refocusing pulse. For example, such a refocusing pulse can minimize image shading caused by $B_1$ inhomogeneity, can decrease scan time since RF pulse durations can be decreased, and can reduce field of view sizes to more particularly select portions of anatomy to image.

According to one embodiment of the invention, the generation of the refocusing pulse via the parallel transmission of at least two channels of RF pulses occurs once every repetition time (TR) of the spin echo sequence's excitation pulse. According to another embodiment of the invention, a generation of a refocusing pulse via the parallel transmission of at least two channels of RF pulses occurs multiple times every TR of the spin echo sequence's excitation pulse.

Figure 2:
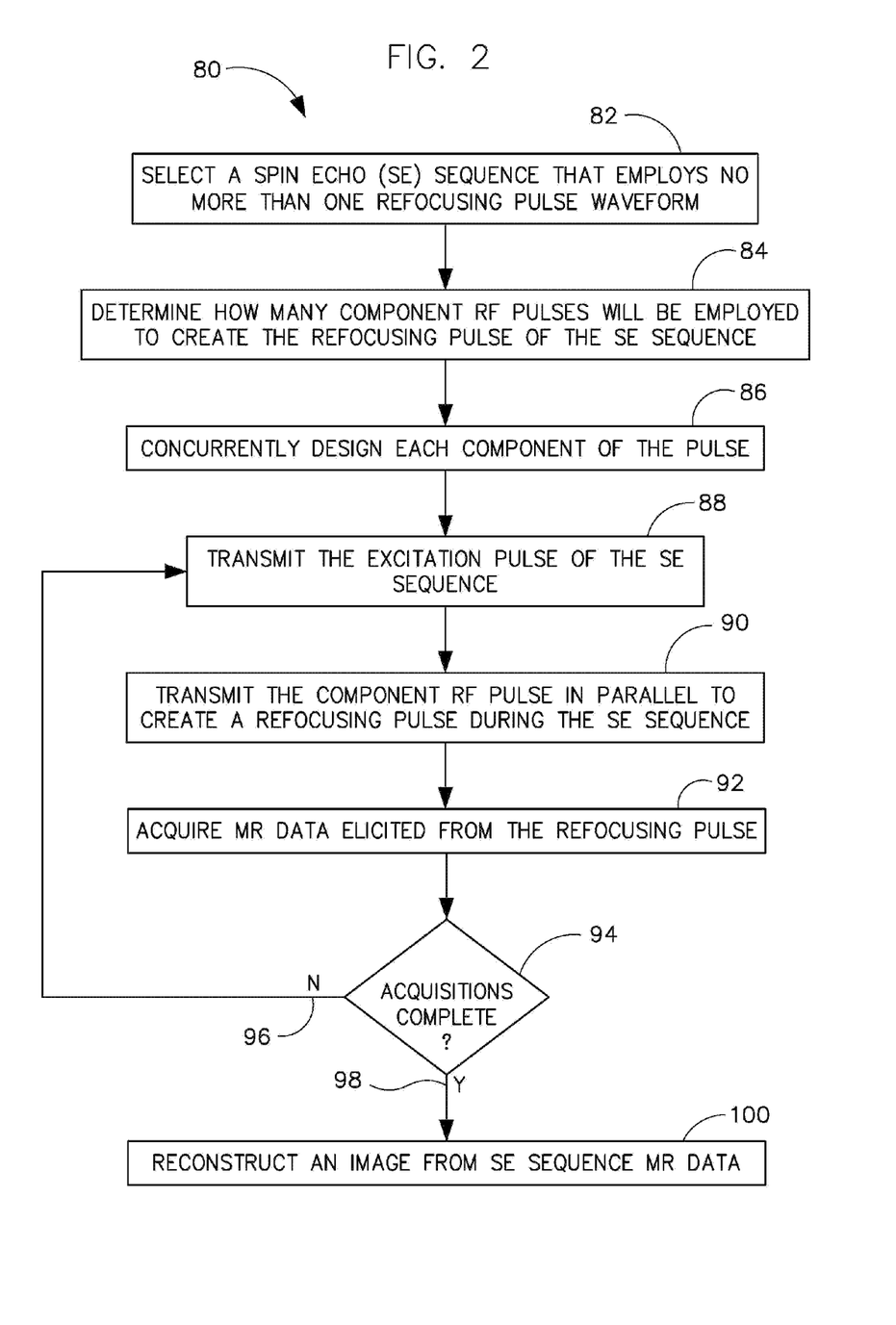
FIG. 2 is a flowchart of a technique for creating a refocusing pulse according to an embodiment of the invention.

Referring now to FIG. 2, a flowchart depicts a technique 80 for spin echo imaging with parallel transmit RF pulses according to an embodiment of the invention. Beginning at block 82, a spin echo sequence that employs one refocusing pulse per sequence cycle is selected. It is contemplated that an MR technician may select the spin echo sequence or that the spin echo sequence may be a preprogrammed selection of the MR apparatus. If a user or technician selects the spin echo sequence, the user may select the spin echo sequence based on the anatomy or object to be imaged and/or based on desired image characteristics.

As will be discussed in detail below, the single refocusing pulse of the selected spin echo (SE) sequence will be created via the parallel transmission of multiple component RF pulses. In other words, multiple RF pulses will be transmitted in parallel, and the superposition of the multiple RF pulses will create the refocusing pulse of the SE sequence.

Since multiple component RF pulses will be employed, at block 84, it is determined how many component RF pulses will be employed to create the refocusing pulse of the SE sequence. Generally, the number of component RF pulses that will be employed to create the refocusing pulse will be equal to the number of transmit coils available. Accordingly, it is contemplated that the number of component RF pulses that will be employed is a preprogrammed quantity equal to the quantity of transmit channels or coils. For example, an MR system may employ eight transmit channels. According to such an embodiment, eight component RF pulses would be employed to create the refocusing pulse, where at least two of the eight component RF pulses employ different waveforms. That is, for example, one set of four component RF pulses having the same waveform could be transmitted in parallel with another set of four component RF pulses having a different waveform. Alternatively, the waveforms of each of the eight component RF pulses could be different. It is noted that an embodiment employing eight component RF pulses is merely an example and is not limiting. Embodiments of the invention may employ two or more component RF pulses to create the refocusing pulse of the SE sequence.

Though it is contemplated that the number of component RF pulses to be employed may be equal to the number of transmit coils available, it is contemplated that a technician or the like may determine that the number of component RF pulses to be employed may be less than the number of transmit coils available. For example, the technician may determine that only two of eight transmit coils will be employed to produce two component RF pulses.

At block 86, each component RF pulse is concurrently designed. In other words, the RF waveform of each component RF pulse is concurrently determined. Since the refocusing pulse will be determined by the superposition of the component RF pulses, the design stage of the component RF pulses can also be considered the design stage of the refocusing pulse.

According to an embodiment of the invention, desired parameters of a refocusing pulse are determined during the design stage. For example, the component RF pulses are designed such that the superposition of the component RF pulses creates a refocusing RF pulse that optimizes magnetization profile and RF energy.

It is noted that the refocusing pulse, once applied, acts on a collection of spins (i.e., a spin ensemble) with different initial phases of transverse magnetization. As such, and since the Bloch equations are linear with respect to initial conditions, it is sufficient to consider only two magnetization vectors of a desired refocusing pulse to determine the parameters thereof. In particular, magnetization vectors m(t) and n(t) respectively having orthogonal initial directions $m(0)=[1, 0, 0]^T$ and $n(0)=[0, 1, 0]^T$ are sufficient to set forth the context of the parameters of the desired refocusing pulse. It is noted that the magnetization vectors are normalized to equilibrium magnetization.

Placing the parameters of the desired refocusing pulse in the context of magnetization vectors m(t) and n(t), and referring to the phase angle of the nutation axis for spins at spatial location vector r as $\theta(r)$, the desired final magnetizations of the desired refocusing pulse can be expressed as follows:

$$m_{des}=[\cos 2\theta(r), \sin 2\theta(r), 0]^T, \text{ and} \quad \text{(Eqn. 1)}$$

$$n_{des}=[\sin 2\theta(r), -\cos 2\theta(r), 0]^T. \quad \text{(Eqn. 2)}$$

Accordingly, for spins with phase angle of nutation axis being $\theta(r)$, $m_{des}$ and $n_{des}$ set forth a desired magnetization profile for the refocusing pulse to be designed. On the other hand, RF pulses with limited RF energy are also desired. Therefore, the component RF pulses are designed such that the superposition of the component RF pulses creates a refocusing pulse producing a magnetization profile as close as possible or desired to the desired magnetization subject to an RF pulse energy constraint.

As such, when designing the refocusing pulse, $\theta(r)$ and $b_l(t)$ are selected or determined such that the final magnetization vectors m(r, T) and n(r, T) (where the italic "T" denotes pulse duration) are as close to $m_{des}$ and $n_{des}$ as possible or desired. It is noted that l is the $l^{th}$ component RF pulse of L total component RF pulses.

It is noted that the above dependency on $\theta(r)$ while determining the waveforms of the component RF pulses can be removed by choosing $b_1(t), \ldots, b_L(t)$ to minimize the following equivalent formulation:

$$J = \sum_r \left\{ \begin{array}{c} [m_x(r, T) + n_y(r, T)]^2 + [m_y(r, T) - n_x(r, T)]^2 + \\ m_z^2(r, T) + n_z^2(r, T) \end{array} \right\} + \quad \text{(Eqn. 3)}$$

$$\lambda \sum_{l=1}^{L} \int_0^T |b_l(t)|^2 dt.$$

It is note that in Eqn. 3, component RF pulses 1 to L are concurrently designed. Subscripts x, y, and z of Eqn. 3 denote individual components of magnetization vectors m and n. The first term of Eqn. 3 implicitly brings the final magnetization vectors toward $m_{des}$ and $n_{des}$ (note the $\theta$ dependency is implicitly included) and the second term is an RF power regularization term with $\lambda$ being a weighting factor balancing the two terms. As will be appreciated by those skilled in the art, both magnetization vectors m and n are subject to the Bloch equation.

The above formulation set forth in Eqn. 3 is an optimal control formulation and, in general, Eqn. 3 does not permit a closed form solution. However, a first order gradient descent method can be implemented to obtain the optimal $b_l(t)$ numerically. Accordingly, Eqn. 3 minimizes the sum of the RF power regularization term and excitation errors of two magnetization vectors, m and n, while accounting for the Bloch equation.

After designing the component RF pulses (i.e., after determining $b_1(t), \ldots, b_L(t)$), the excitation pulse of the SE sequence is transmitted at block 88. The excitation pulse is a created via a parallel channel transmission of multiple component excitation RF pulses. In other words, the excitation pulse is created via a superposition of RF pulses. These component excitation RF pulses may be designed or determined via a variety of techniques. It is noted that these component excitation RF pulses are not the same pulses designed at block 86. At block 90, however, the component RF pulses designed at block 86 are transmitted in parallel via a plurality of transmit coils, thus creating a refocusing pulse via the superposition of the component RF pulses. MR data from an echo, which is generated in response to the refocusing pulse, are acquired at block 92.

Proceeding to block 94, it is determined whether or not acquisitions are complete. In other words, it is determined whether the desired k-space has been filled. If the acquisitions are not complete 96, process control proceeds back to block 88, where the SE sequence excitation pulse created via the superposition of component excitation RF pulses is again transmitted. If, on the other hand, it is determined that acquisitions are complete 98, process control proceeds to block 100, where an image is reconstructed from the acquired MR data. It is contemplated that the image be displayed to a person or used for another purpose.

Figure 3:
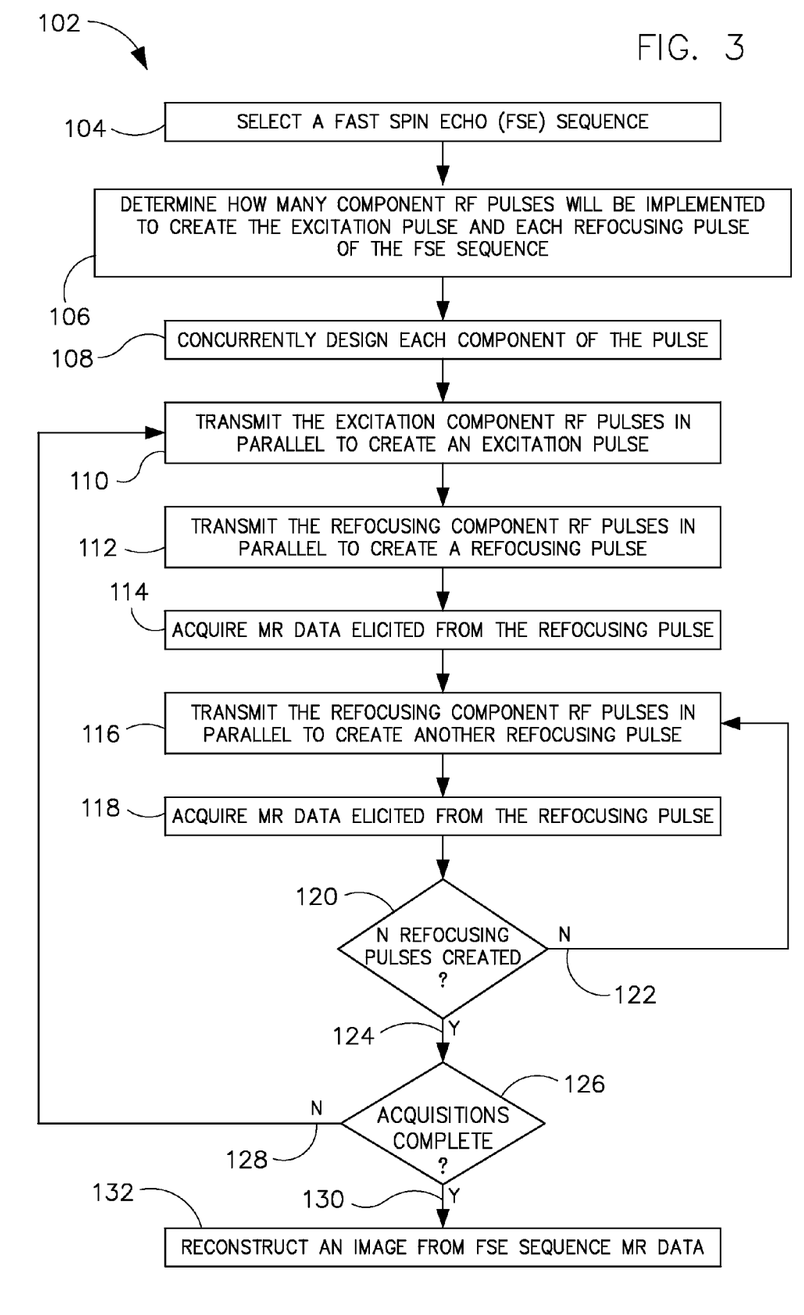
FIG. 3 is a flowchart of a technique for creating a refocusing pulse according to another embodiment of the invention.

As explained above, embodiments of the invention are also applicable to spin echo sequences that employ more than one refocusing pulse per TR to generate multiple MR signals. Examples of such sequences include, but are not limited to fast spin echo (FSE) sequences, RARE sequences, and the like. Referring to FIG. 3, a flowchart depicts a technique 102 for FSE imaging with parallel transmit RF pulses according to an embodiment of the invention. It is noted that technique 102, though explained in the context of an FSE sequence, is applicable to other spin echo sequences that employ multiple refocusing pulses per TR—not just FSE sequences. Beginning at block 104, a FSE sequence that employs N refocusing pulses per TR is selected, where N is an integer greater than one. It is contemplated that an MR technician may select the FSE sequence or that the FSE sequence may be a preprogrammed selection of the MR apparatus. If a user or technician selects the spin echo sequence, the user may select the fast spin echo sequence based on desired image characteristics and/or available scan time. The number of refocusing pulses, N, employed in the FSE sequence may be selected by a user or pre-determined by the MR apparatus.

Similar to the embodiment depicted in technique 80 of FIG. 2, multiple component RF pulses will be employed via technique 102 to create a refocusing pulse. Since multiple component RF pulses will be employed, at block 106 (FIG. 3), it is determined how many component RF pulses will be employed to create the refocusing pulses of the FSE sequence. According to one embodiment, the quantity of component RF pulses that will be employed will be preprogrammed and be equal to the number of transmit coils or channels.

At block 108, each component RF pulse is concurrently designed for each refocusing pulse to be applied. In other words, the RF waveform of each component RF pulse is concurrently determined. Since each refocusing pulse of the FSE sequence will be determined by the superposition of the component RF pulses, the design stage of the component RF pulses can also be considered the design stage of each refocusing pulse.

Since refocusing pulses in an FSE sequence are generally identical, it is sufficient to consider a 90 degree excitation pulse followed by a single refocusing pulse with the additional Carr Purcell Meiboom Gill (CPMG) constraint that the phase angle of the nutation axis at spatial location vector r for the excitation pulse $\theta(r)$ needs to lead (or trail) the phase angle of the refocusing pulse by 90 degrees. In the context of the parallel transmission of component RF pulses, $\theta(r)$ is in general not constant over space due to the complex nature of the $B_1+$ map and is treated as a design parameter. As such, during the design of the component RF pulses, a $\theta(r)$ is chosen such that the excitation pulse with its nutation axis phase being $\theta(r)$ and the refocusing pulse with its nutation axis phase being $\theta(r)+90$ drive the magnetization as close to a targeted profile as possible or desired.

The durations of the excitation and refocusing pulses can be referred to as $t_1$ and $t_2$, respectively. To ensure the refocusing pulse can refocus a collection of spins with different initial phases of transverse magnetizations, it is again sufficient to consider only two magnetization vectors m(t) and n(t), where $m(t_1)$ is the magnetization right after the excitation pulse is applied and the transverse component of $n(t_1)$ is 90 degrees ahead of $m(t_1)$. The desired transverse components of $m(t_1)$ and $n(t_1)$ have magnitude 1 everywhere (normalized to equilibrium magnetization) and phase angles $\theta(r)+90$ and $\theta(r)+180$, respectively. Note that due to the CPMG condition, the phase of the nutation axis for the refocusing pulse is $\theta(r)+90$ as well. Therefore, m is expected to remain as $m(t_1)$ and n is expected to be flipped to $-n(t_1)$ at the end of the refocusing pulse at time $t=t_1+t_2$.

Accordingly, the design of the component RF pulses and therefore the refocusing pulses, can be formulated as choosing L component RF pulses (e.g., L transmit channels), $b_1(t), \ldots, b_L(t)$ in such a manner to minimize the following formulation:

$$J = \sum_r \left\{ \begin{array}{l} (|m_{xy}(t_1)| - 1)^2 + m_z^2(t_1) + (|m_{xy}(t_1+t_2)| - 1)^2 + \\ m_z^2(t_1+t_2) + (|n_{xy}(t_1+t_2)| - 1)^2 + n_z^2(t_1+t_2) + \\ [m_{xy}(t_1+t_2) - m_{xy}(t_1)]^2 + [n_{xy}(t_1+t_2) + n_{xy}(t_1)] \end{array} \right\} + \quad \text{(Eqn. 4)}$$

$$\lambda \sum_{l=1}^{L} \int_0^{t_1+t_2} |b_l(t)|^2 dt,$$

where $0<t<t_1$ is the excitation pulse interval, $t_1<t<t_1+t_2$ is the refocusing pulse interval, and L is equivalent to the number of component RF pulses. According to an embodiment represented by Eqn. 4, and in light of the excitation pulse interval and the refocusing pulse interval, L component RF pulses are employed to create an excitation pulse as well as each refocusing pulse. That is, L waveforms over interval $0<t<t_1$ determine the L component RF pulses (i.e., excitation component RF pulses) of the excitation pulse, and the L waveforms over interval $t_1<t<t_1+t_2$ will determine the L component RF pulses (i.e., refocusing component RF pulses) of each refocusing pulse. As such, according to the embodiment set forth in Eqn. 4, not only are component RF pulses of the refocusing pulses concurrently defined, but the component RF pulses of the excitation pulse are also concurrently defined. Subscripts x, y, and z denote the transverse and longitudinal components of vectors m and n. The first term of Eqn. 4 enforces the desired magnetization conditions at $t=t_1$ and $t=t_1+t_2$. Note the $\theta$ dependency is implicitly included. The second term is an RF power regularization term with $\lambda$ being a weighting factor balancing the two terms. Both m and n are subject to the Bloch equation. The above formulation is an optimal control formulation and can be converted into a 3-point boundary-value problem. According to an embodiment of the invention, a first order gradient descent method is implemented to obtain the optimal $b_l(t)$ numerically. Similar to Eqn. 3, Eqn. 4 also minimizes the sum of the RF power regularization term and errors of two magnetization vectors, m and n, while also accounting for the Block equation. However, Eqn. 4, also satisfies the CPMG condition and jointly designs the excitation and refocusing pulses.

After designing the component RF pulses for the excitation pulse and the refocusing pulses (i.e., after determining $b_1(t), \ldots, b_L(t)$), the excitation component RF pulses are transmitted in parallel via a plurality of transmit coils at block 110 to create the excitation pulse of the FSE sequence. In other words, RF pulses having the $b_1(t), \ldots, b_L(t)$ waveforms between $0<t<t_1$ are transmitted in parallel to superpose and create the excitation pulse. At block 112, the refocusing component RF pulses are transmitted in parallel to create the refocusing pulse. In other words, RF pulses having the $b_1(t), \ldots, b_L(t)$ waveforms between $t_1<t<t_1+t_2$ are transmitted in parallel to superpose and create the refocusing pulse. MR data from an echo, which is generated in response to the refocusing pulse transmitted at block 112, are acquired at block 114.

At block 116, the refocusing component RF pulses are again transmitted to create a second refocusing pulse in the FSE sequence. MR data from an echo, which is generated in response to the refocusing pulse transmitted at block 116, are acquired at block 118. Process control then proceeds to block 120, where it is determined whether the N refocusing pulses of the FSE sequence have been created. If it is determined that the N refocusing pulses have not been created 122, process control proceeds back to block 116, where the refocusing component RF pulses are again transmitted in parallel to create another refocusing pulse of the FSE sequence and where MR data is acquired from an echo generated therefrom. Alternatively, if it is determined that N refocusing pulses have been created 124, process control proceeds to block 126, where it is determined if acquisitions are complete. That is, it is determined whether or not the desired k-space has been filled.

If it is determined that acquisitions are not complete 128, the excitation component RF pulses are again transmitted in parallel to create another excitation pulse at block 110. On the other hand, if it is determined that the desired k-space has been filled 130, process control proceeds to block 132, where an image is reconstructed from acquired FSE sequence image data. It is contemplated that the image be displayed to a person or used for another purpose.

Embodiments of the invention, whether employing technique 80 of FIG. 2 or technique 102 of FIG. 3, help to minimize image shading caused by $B_1$ inhomogeneities since the refocusing pulse(s) created via the superposition of the component RF pulses is designed to account for such inhomogeneities. In addition, since the parallel transmit refocusing pulse(s) tends to have a shorter duration than a conventional single-channel refocusing pulse, embodiments of the invention help to minimize scan time. It is also noted that embodiments of the invention can be employed to reduce a field of excitation since the profile of the refocusing pulse can be more selectively chosen.

As set forth above with respect to FIGS. 2 and 3, embodiments of the invention are directed to, in part, the creation of refocusing pulses via the parallel channel transmission of multiple component RF pulses. Embodiments of the invention are applicable to spin echo sequences that employ N refocusing pulses per TR of the spin echo sequence's excitation pulse. N may be an integer equal to one (see e.g., technique 80), or N may be an integer greater than one (see e.g., technique 102).

Embodiments of the invention provide for a computer implemented apparatus and method of creating a refocusing pulse in a spin echo MR imaging sequence where one or more refocusing pulses are implemented.

In accordance with one embodiment, a magnetic resonance imaging (MRI) apparatus including an MRI system having a plurality of gradient coils positioned about a bore of a magnet, a radio-frequency (RF) transceiver system, an RF switch controlled by a pulse module to transmit RF signals to an RF coil assembly to acquire MR images, and a computer. The computer is programmed to implement a spin echo sequence to acquire magnetic resonance (MR) data from an object, where the spin echo sequence includes an excitation RF pulse and at least one refocusing pulse per repetition time (TR) of the excitation pulse. The computer is also programmed to transmit at least two component RF pulses in parallel channels during implementation of the spin echo sequence to refocus a plurality of spins in the object and programmed to reconstruct an image from spin echo sequence image data. The at least two RF pulses are configured produce a first refocusing RF pulse that refocuses the plurality of spins in the object.

In accordance with another embodiment, a method of magnetic resonance (MR) imaging includes implementing a spin echo acquisition sequence, where the spin echo sequence includes an excitation pulse and one of a single refocusing pulse per repetition time (TR) of the excitation pulse and multiple refocusing pulses per TR of the excitation pulse. The method also includes transmitting a plurality of RF component refocusing pulses during the spin echo acquisition sequence such that the plurality of RF component refocusing pulses superpose to create one of the single refocusing pulse and one refocusing pulse of the multiple refocusing pulses. The method further includes acquiring MR data from an echo generated in response one of the single refocusing pulse and the one refocusing pulse of the multiple refocusing pulses, reconstructing an MR image from the acquired MR data, and displaying the MR image.

In accordance with yet another embodiment, a computer readable storage medium having a sequence of instructions stored thereon is set forth. The instructions cause the computer to acquire magnetic resonance (MR) data from an object via application of a spin echo sequence, where the spin echo sequence includes an excitation RF pulse and N refocusing pulse(s) per repetition time (TR) of the excitation RF pulse. N is one of an integer equal to one and an integer greater than one. The instructions also cause the computer to create a first refocusing pulse of the N refocusing pulse(s) via a parallel transmission of at least two component RF refocusing pulses, and reconstruct an image from MR data acquired via the spin echo sequence.

This written description uses examples to disclose embodiments of the invention, including the best mode, and also to enable any person skilled in the art to practice embodiments of the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A magnetic resonance imaging (MRI) apparatus comprising:
    an MRI system having a plurality of gradient coils positioned about a bore of a magnet, and a radio-frequency (RF) transceiver system and an RF switch controlled by a pulse module to transmit RF signals to an RF coil assembly to acquire MR images; and
    a computer programmed to:
        implement a spin echo sequence to acquire magnetic resonance (MR) data from an object, wherein the spin echo sequence comprises an excitation RF pulse and at least one refocusing pulse per repetition time (TR) of the excitation pulse;
        transmit at least two component RF pulses in parallel channels during implementation of the spin echo sequence to refocus a plurality of spins in the object, wherein the at least two RF pulses produce a first refocusing RF pulse that refocuses the plurality of spins in the object; and
        reconstruct an image from spin echo sequence image data.

2. The MRI apparatus of claim 1 wherein the computer is further programmed to concurrently design the at least two component RF pulses such that the at least two component RF pulses are configured to create a magnetization profile that minimizes a sum of an excitation error and an RF energy term.

3. The MRI apparatus of claim 2 wherein the computer is programmed to transmit the at least two component RF pulses in parallel only once during each TR of the excitation pulse.

4. The MRI apparatus of claim 3 wherein parameters of the at least two RF pulses are configured to minimize the following equation:

$$\sum_r \left\{ \begin{array}{c} [m_x(r,T) + n_y(r,T)]^2 + [m_y(r,T) - n_x(r,T)]^2 + \\ m_z^2(r,T) + n_z^2(r,T) \end{array} \right\} + \lambda \sum_{l=1}^{L} \int_0^T |b_l(t)|^2 dt,$$

where $m_x$, $m_y$, $m_z$, $n_x$, $n_y$, and $n_z$ are magnetization vectors, L is total number of component RF pulses in the at least two component RF pulses, l is a $l^{th}$ component RF pulse of the at least two component RF pulses, T is a pulse duration of the refocusing RF pulse, $b_1(t)$ to $b_l(t)$ are waveforms for each of the at least two component RF pulses, respectively, $\lambda$ is a weighting factor, and r is a spatial location vector.

5. The MRI apparatus of claim 2 wherein the spin echo sequence comprises at least two refocusing pulses per TR of the excitation pulse, wherein the computer is further programmed to transmit the at least two component RF pulses in parallel channels during implementation of the spin echo sequence to produce a second refocusing RF pulse configured to refocus the plurality of spins in the object.

6. The MRI apparatus of claim 5 wherein the design of the at least two component RF pulses satisfies a Carr Purcell Meiboom Gill (CPMG) condition.

7. The MRI apparatus of claim 5 wherein parameters of the at least two RF pulses are configured to minimize the following equation:

$$\sum_r \left\{ \begin{array}{l} (|m_{xy}(t_1)| - 1)^2 + m_z^2(t_1) + (|m_{xy}(t_1 + t_2)| - 1)^2 + \\ m_z^2(t_1 + t_2) + (|n_{xy}(t_1 + t_2)| - 1)^2 + n_z^2(t_1 + t_2) + \\ [m_{xy}(t_1 + t_2) - m_{xy}(t_1)]^2 + [n_{xy}(t_1 + t_2) + n_{xy}(t_1)] \end{array} \right\} + \lambda \sum_{l=1}^{L} \int_0^{t_1+t_2} |b_l|^2 dt,$$

where $m_{xy}$, $m_z$, $n_{xy}$, and $n_z$ are magnetization vectors, L is total number of component RF pulses of the at least two component RF pulses, l is an $l^{th}$ component RF pulse of the at least two component RF pulses, $t_1$ is a duration of an excitation pulse of the spin echo sequence, and $t_2$ is a duration of the refocusing RF pulse, $b_1(t)$ to $b_L(t)$ between $0<t<t_1$ are excitation component pulse waveforms of an excitation pulse, $b_1(t)$ to $b_L(t)$ between $t_1<t<t_1+t_2$ are refocusing pulse component waveforms of the first and second refocusing RF pulses, $\lambda$ is a weighting factor, and r is a spatial location vector.

8. The MRI apparatus of claim 1 wherein the refocusing RF pulse is configured to minimize image shading resulting from magnetic field inhomogeneities.

9. The MRI apparatus of claim 1 wherein the refocusing RF pulse is configured to reduce a field of excitation.

10. A method of magnetic resonance (MR) imaging comprising:
   implementing a spin echo acquisition sequence, wherein the spin echo sequence comprises an excitation pulse and one of:
      a single refocusing pulse per repetition time (TR) of the excitation pulse; and
      multiple refocusing pulses per TR of the excitation pulse;
   transmitting a plurality of RF component refocusing pulses during the spin echo acquisition sequence such that the plurality of RF component refocusing pulses superpose to create one of the single refocusing pulse and one refocusing pulse of the multiple refocusing pulses;
   acquiring MR data from an echo generated in response one of the single refocusing pulse and the one refocusing pulse of the multiple refocusing pulses;
   reconstructing an MR image based on the acquired MR data; and
   displaying the MR image.

11. The method of claim 10 further comprising concurrently designing the plurality of RF component refocusing pulses.

12. The method of claim 11 wherein the spin echo sequence comprises the single refocusing pulse per TR of the excitation pulse.

13. The method of claim 11 further comprising transmitting the plurality of RF component refocusing pulses such that the plurality of RF component refocusing pulses superpose to create an additional refocusing pulse of the multiple refocusing pulses.

14. The method of claim 13 further comprising transmitting a plurality of RF component excitation pulses such that the plurality of RF component excitation pulses superpose to create the excitation pulse of the spin echo sequence, wherein concurrently designing the plurality of RF component refocusing pulses comprises concurrently designing the plurality of RF component refocusing pulses and the plurality of RF component excitation pulses.

15. A computer readable storage medium having a sequence of instructions stored thereon, which, when executed by a computer, causes the computer to:
   acquire magnetic resonance (MR) data from an object via application of a spin echo sequence, the spin echo sequence comprising an excitation RF pulse and N refocusing pulse(s) per repetition time (TR) of the excitation RF pulse, wherein N is an integer greater than or equal to one;
   create a first refocusing pulse of the N refocusing pulse(s) via a parallel transmission of at least two component RF refocusing pulses; and
   reconstruct an image from MR data acquired via the spin echo sequence.

16. The computer readable storage medium of claim 15 wherein the instructions further cause the computer to create a second refocusing pulse of the N refocusing pulse(s) via a second parallel transmission of the at least two component RF refocusing pulses.

17. The computer readable storage medium of claim 16 wherein the instructions further cause the computer to create the excitation pulse via a parallel transmission of at least two component RF excitation pulses.

18. The computer readable storage medium of claim 16 wherein the spin echo sequence is a fast spin echo sequence.

19. The computer readable storage medium of claim 17 wherein the instructions further cause the computer to concurrently design the at least two component RF refocusing pulses and the at least two component RF excitation pulses prior to application of the spin echo sequence, and wherein the concurrent design accounts for a Bloch equation and minimizes a sum of excitation errors and an RF power regularization term.

20. The computer readable storage medium of claim 15 wherein the instructions further cause the computer to concurrently design the at least two component RF refocusing pulses prior to application of the spin echo sequence, and wherein the concurrent design of the at least two component RF pulses accounts for a Bloch equation and minimizes a sum of excitation errors and an RF power regularization term.

* * * * *